United States Patent
Lysaght

(10) Patent No.: US 7,174,973 B1
(45) Date of Patent: Feb. 13, 2007

(54) POWER TOOL INTERFACE

(75) Inventor: Richard G. Lysaght, Hicksville, OH (US)

(73) Assignee: C.E. Electronics, Inc., Bryan, OH (US)

( * ) Notice: Subject to any disclaimer, the term of this patent is extended or adjusted under 35 U.S.C. 154(b) by 359 days.

(21) Appl. No.: 10/876,125

(22) Filed: Jun. 24, 2004

(51) Int. Cl.
*E21B 3/00* (2006.01)
*G05B 24/02* (2006.01)
*H03H 1/00* (2006.01)

(52) U.S. Cl. ............................. 173/217; 323/350
(58) Field of Classification Search ............. 323/349, 323/350, 351; 173/4, 11, 140, 141, 148, 173/152, 179, 217
See application file for complete search history.

(56) References Cited

U.S. PATENT DOCUMENTS

| | | | |
|---|---|---|---|
| 4,689,534 A * | 8/1987 | Gerber et al. ............... 388/809 |
| 5,014,793 A | 5/1991 | Germanton et al. | |
| 5,594,306 A * | 1/1997 | Caporusso et al. .......... 318/245 |
| 6,347,554 B1 | 2/2002 | Klingler | |
| 6,430,463 B1 | 8/2002 | Lysaght | |
| 6,511,200 B2 * | 1/2003 | Matsunaga .................. 362/119 |
| 6,765,317 B2 * | 7/2004 | Chu ........................... 307/150 |
| 7,036,703 B2 * | 5/2006 | Grazioli et al. ............... 227/10 |

* cited by examiner

*Primary Examiner*—Matthew V. Nguyen
(74) *Attorney, Agent, or Firm*—Emch, Schaffer, Schaub & Porcello Co., L.P.A.

(57) ABSTRACT

This interface is an apparatus for controlling a power supply delivering power to a DC powered tool. The interface is connected between the DC power supply and the DC tool wherein the interface is configured to read signals from the tool and control the power supplied by allowing the power supply to run, brake, reverse or jog the tool. A microprocessor is connected to the interface programmed to provide a specific power in response to the signals from the tool read by the interface. The interface includes a number of field effect transistors. They are PFET1, PFET2, NFET1, and NFET2.

34 Claims, 2 Drawing Sheets

POWER TOOL INTERFACE

TECHNICAL FIELD OF THE INVENTION

The interface of this invention is a circuit that allows a user to take a standard power supply and use it to control a DC brush or brush-less tool. This interface has the ability to read the signals from the tool and manipulate the voltage supplied by the power supply in order to run and brake the tool properly.

BACKGROUND OF THE INVENTION

This invention relates to a process and apparatus that controls the power delivered to a tool without the use of complicated components. Preciseness and consistency are very important to mass production operations, such as automobile assembly plants. Power tool driving threaded fasteners must be consistent. Industry typically incorporates controlling devices into the power tool. This is very expensive. Also, this approach often has been unsatisfactory because the measuring and controlling are not direct enough. These attempts often lead to large, bulky tools.

For example, in a typical power tool, an input shaft applies torque to a spindle through a series of bevel gears on the shaft and spindle. A transducer measures the torque on the spindle through a torsionally resilient device strain gauges, a gear case, planet gears and ring gears. This circuitous path at best provides a slow response. Measuring and controlling without a transducer would provide a huge cost savings.

SUMMARY OF THE INVENTION

The present invention is directed to an apparatus for controlling a power supply delivering power to a DC powered tool. An interface is connected between the DC power supply and the DC tool wherein the interface is configured to read signals from the tool and control the power supplied by the power supply to run, brake, reverse or jog the tool. A microprocessor is connected to the interface programmed to provide a specific power in response to the signals from the tool read by the interface. The interface includes a number of field effect transistors. They are PFET1, PFET2, NFET1, and NFET2.

The circuit of this invention includes a control path element between the microprocessor and the interface to control current flowing from the power supply to the tool. The control path element is an opto-isolator. The circuit also includes an enable circuit that allows current from the power supply to the tool to be interrupted. The enable circuit is a transistor. The apparatus also includes a signal path element responsive to the signal flow from the tool to the interface. The signal path element is a transistor.

DETAILED DESCRIPTION OF THE INVENTION

Figure 1:
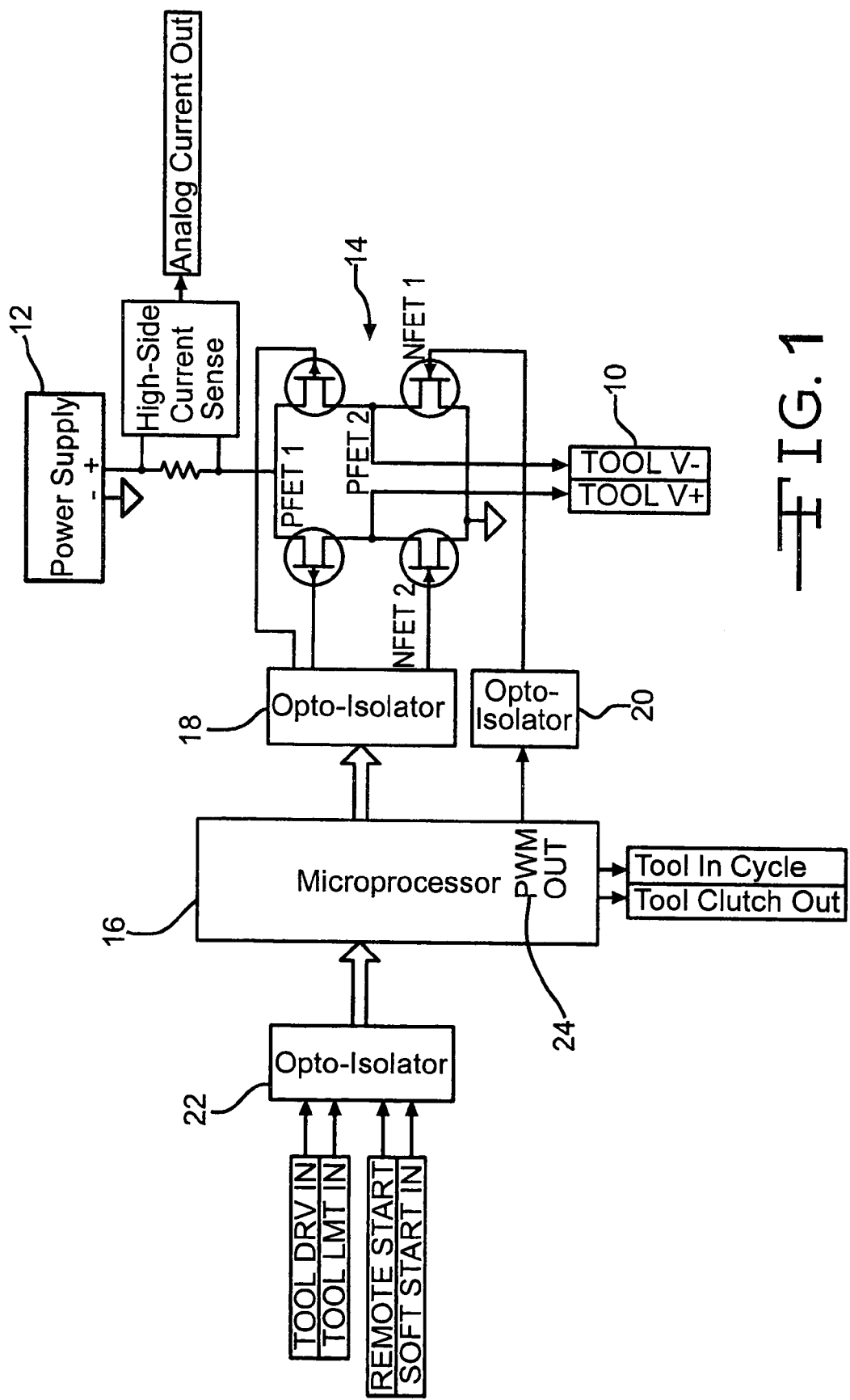
FIG. 1 is a block diagram for the control circuit of this invention.

FIG. 1 is a block diagram for the control circuit of this invention providing power to DC power tool 10. DC power supply 12 provides power to tool 10 through interface 14. Microprocessor 16 is connected to interface 14 through opto-isolator 18 and opto-isolator 20. Interface 14 includes field effect transistors PFET1, PFET2, NFET1 and NFET2.

When tool 10 is at rest, microprocessor 16 will turn on PFET1 with all of the other FETs off. The microprocessor is programmed, when the tool is at rest, to allow PFET1 to conduct by grounding its gate and placing all remaining FETs in their non-conducting states. This action provides a positive voltage to tool 10 so that signals can be read by the microprocessor. However, since NFET1 is off there is no complete path to ground. Therefore tool 10 cannot run. The microprocessor is programmed to control the gate voltages of PFET1 and NFET1. As a result, PFET1 and NFET1 provide power to the tool allowing the tool to run in a forward or clockwise manner.

When a signal comes back from tool 10 (TOOL DRV IN) or from an outside source (REMOTE START), microprocessor 16 turns on both PFET1 and NFET1. Opto isolator 22 transmits the outside source signals to microprocessor 16. This action allows current to flow through the tool's motor, allowing it to spin. If the run signal is removed (either TOOL DRV IN or REMOTE START), NFET1 is turned off and tool 10 is allowed to coast to a stop.

The microprocessor is programmed to ground the gate of NFET1, stopping the current flow through the tool and allowing the tool to coast to a stop. The tool also includes a clutch. The tool sends a signal through the interface to the microprocessor when the clutch engages wherein the microprocessor is programmed to briefly stop all FETs from conducting. The microprocessor is programmed to allow PFET2 and NFET2 to conduct after the clutch engages to reverse bias and quickly stop the tool from running.

If the clutch of tool 10 engages, a signal is sent back to microprocessor 16 (TOOL LMT IN). Briefly, all FETs are turned off. Then tool 10 is reverse biased (PFET2 and NFET2 are turned on). This action quickly stops the tool from spinning so the fastener is not over-torqued. After the braking action is complete all FETs are turned off briefly and PFET1 is turned back on so that signals from tool 10 can once again be read from microcontroller 16.

The microprocessor also includes PWM 24 configured to control NFET1 of the interface. The PWM is configured to turn the gate voltage of NFET1 on and off. The PWM thereby limits the current flow through the tool by providing a pulsed signed to NFET1. When the soft-start feature is enabled, NFET1 is pulsed by pulse width modulator 24 when tool 10 starts running.

Figure 2:
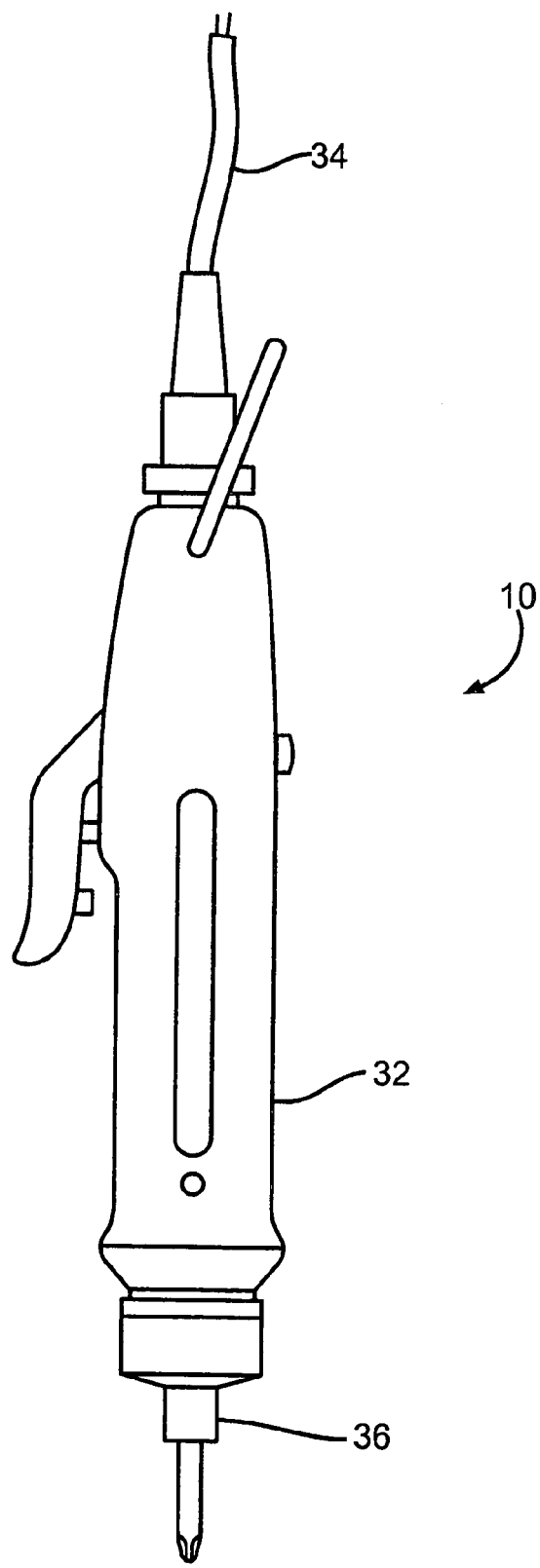
FIG. 2 is a schematic view of a conventional power driven tool

FIG. 2 is a schematic of conventional power drive tool 10. Conventional tool 10 depends upon power for its operation. Tool 10 includes tool housing 32 and electric cable 34. Tool 10 also includes spindle 36. Electric cable 34 connects to interface 14.

The apparatus also includes a control path element between the microprocessor and the interface to control current flowing from the power supply to the tool. The control path element is an opto-isolator. The apparatus also includes an enable circuit that allows current from the power supply to the tool to be interrupted. Preferably, the enable circuit is a transistor. The apparatus also includes a signal path element responsive to the signal flow from the tool to the interface. Preferably, the signal path element is a transistor.

In another embodiment, the microprocessor is configured to turn on both PFET1 and NFET1 when the signals back from the tool are tool drive in signals or when the signals are remote start signals from an outside source. The tool is turned off and allowed to coast to a stop when the run signals are removed. All FET's are placed in their non-conductive state briefly and the NFET2 and PFET2 are allowed to conduct reverse biasing the tool when the tool limit in signals is received. The NFET1 is pulsed by the PWM when the soft start signal is received by the microprocessor.

The microprocessor also is programmed to provide a specific voltage. Further, the tool includes a means to run the tool at a run, jog, reverse and break settings.

Typical Operation: When the tool is at rest, the microprocessor will turn on PFET1 with all of the other FET's off. This action provides a positive voltage to the tool so that signals can be read back from the tool. However, since NFET1 is off there is no complete path to ground. Therefore the tool cannot run (current cannot flow through the tool's motor).

When a signal comes back from the tool (TOOL DRV IN) or from an outside source (REMOTE START), the microprocessor turns on both PFET1 and NFET1. This action allows current to flow through the tool's motor, allowing it to spin.

If the run signal is removed (either TOOL DRV IN or REMOTE START), NET1 is turned off and the tool is allowed to coast to a stop.

If the tool's clutch engages, a signal is sent back to the microprocessor (TOOL LMT IN). Briefly, all FETs are turned off. Then the tool is reverse biased (PFET2 and NFET2 are turned on). This action quickly stops the tool from spinning so the fastener is not over-torqued.

After the braking action is complete all FETs are turned off briefly and PFET1 is turned back on so that signals from the tool can once again be read from the microcontroller.

Soft Start: When the soft-start feature is enabled, NFET1 is pulsed by the microprocessor's pulse width modulator when the tool starts running. This limits the amount of current that can flow through the tool which in turn greatly slows down the speed at which the motor can spin. This action allows the tool to engage the head of the fastener at a slower rate of speed before the tool ramps up to full speed. This feature is very useful with Phillips head screws and other fasteners where the driver can miss or slip out of the fasteners head.

Remote Start: This feature aids machine designers in fixturing tools for remote control. Often times a machine designer must modify or port a tool or power supply in order to control it remotely through a PLC or other control mechanism. The Remote Start input on this power supply allows a machine designer to accomplish this task effortlessly.

Analog Current Out: The analog current output provides a means of reading the amount of current being consumed by the tool. This output creates an analog voltage proportional to the amount of current being consumed by the tool. This voltage can then be read and used by external controls. Knowing the amount of current being used by the tool can aid a machine designer in creating sophisticated controls. This value is the key to knowing how hard to the tool is working.

This value might be used in gauging when the brushes on a brush type tool are wearing out. This value might also aid the designer in knowing the type of material that a brush-less tool is fastening. For instance, a screw being driven in to plastic will draw much more current the first time it drills through a hole. Subsequent tightenings into the same hole will not need as much current (and may also be an indication of scrap).

Tool In Cycle and Tool Clutch Out:

These two signals, tool in cycle and tool clutch out, are created by the microprocessor so that external devices can monitor and qualify the fastening process. Through the use of these two signals, an external device will be able to distinguish between good fastening, incomplete fastenings (no-clutch), and double hits (clutch engages at tool start). Knowing the difference between a good and bad fastening process can significantly improve quality in a production environment.

In another embodiment, the microprocessor is configured to read the run and clutch signals and has the ability to report these signals to an external device.

Another embodiment configures the external device to read the run and clutch signals. Based on the duration of the run signal (comparing this signal to a present minimum run time and a maximum run time) and the existence of the clutch signal, the external device determines if the fastening process was good or bad.

In still another device, the braking circuit is configured to measure the current flowing through the tool by measuring the voltage drop across a high side current sense resistor, see FIG. 1, and is able to report this current value to the external device.

The external device also may be configured to use the current draw to determine that the tool is running (in the absence of a run signal) by comparing the signal to a programmable threshold signal.

While the FET's are the preferred components of the interface, other components may be used as well. The FET's comprise a drain, gate and source. Opening and closing the gate allows current to flow from the source to the drain. In the same manner, transistors may be used in place of the FET's. The transistors include an emitter, base and collector with voltage flowing from the collector to the emitter when the base is biased with a voltage. While not as preferred, simple electrical switches may be used as well.

The above detailed description of the present invention is given for explanatory purposes. It will be apparent to those skilled in the art that numerous changes and modifications can be made without departing from the scope of the invention. Accordingly, the whole of the foregoing description is to be construed in an illustrative and not a limitative sense, the scope of the invention being defined solely by the appended claims.

I claim:

1. An apparatus for controlling a power supply delivering power to a DC powered tool comprising:
   a DC power driver tool;
   a DC power supply;
   an interface connected between the power supply and the tool wherein the interface is configured to read signals from the tool and control the power supplied by the power supply to run, brake, reverse or jog the tool, wherein the interface includes PFET1, PFET2, NFET1, and NFET2 and;
   a microprocessor connected to the interface programmed to provide a specific power in response to the signal from the tool read by the interface.

2. An apparatus according to claim 1 wherein the microprocessor is programmed, when the tool is at rest, to allow PFET1 to conduct by grounding its gate and placing all remaining FETs in their non-conducting states.

3. An apparatus according to claim 2 wherein PFET1 provides a voltage to the tool so that signals from the tool can be read by the microprocessor.

4. An apparatus according to claim 1 wherein the microprocessor is programmed to control the gate voltages of PFET1 and NFET1.

5. An apparatus according to claim 4 wherein PFET1 and NFET1 provide power to the tool allowing the tool to run in a forward or clockwise manner.

6. An apparatus according to claim 5 wherein the microprocessor is programmed to ground the gate of NFET1, stopping the current flow through the tool and allowing the tool to coast to a stop.

7. An apparatus according to claim 1 wherein the tool includes a clutch wherein the tool sends a signal through the interface to the microprocessor when the clutch engages wherein the microprocessor is programmed to turn briefly stop all FETs from conducting.

8. An apparatus according to claim 7 wherein the microprocessor is programmed to allow PFET2 and NFET2 to conduct after the clutch engages to reverse bias and quickly stop the tool from running.

9. An apparatus according to claim 1 wherein the microprocessor includes a PWM configured to control NFET1 of the interface.

10. An apparatus according to claim 9 wherein the PWM is configured to turn the gate voltage of NFET1 on and off.

11. An apparatus according to claim 9 wherein the PWM thereby limits the current flow through the tool by providing pulsed signed to NFET1.

12. An apparatus according to claim 1 for controlling a power supply delivering power to a DC powered tool comprising:
    a DC power driver tool:
    a DC power supply;
    an interface connected between the power supply and the tool wherein the interface is configured to read signals from the tool and control the power supplied by the power supply to run, brake, reverse or jog the tool;
    a microprocessor connected to the interface programmed to provide a specific power in response to the signal from the tool read by the interface; and
    including a control path element between the microprocessor and the interface to control current flowing from the power supply to the tool.

13. An apparatus according to claim 12 wherein the control path element is an opto-isolator.

14. An apparatus according to claim 1 including an enable circuit that allows current from the power supply to the tool to be interrupted.

15. An apparatus according to claim 14 wherein the enable circuit is a transistor.

16. An apparatus according to claim 1 including a signal path element responsive to the signal flow from the tool to the interface.

17. An apparatus according to claim 16 wherein signal path element is a transistor.

18. An apparatus according to claim 1 wherein the microprocessor is configured to turn on both PFET1 and NFET1 when the signals back from the tool are tool drive in signals or when the signals are remote start signals from an outside source.

19. An apparatus according to 1 wherein the tool is turned off and allowed to coast to a stop when the run signals are removed.

20. An apparatus according to claim 8 wherein all FET's are placed in their non-conductive state briefly and then NFET2 and PFET2 are allowed to conduct reverse biasing the tool when the tool limit in signals is received.

21. An apparatus according to claim 8 wherein all FET's are placed in their non-conductive state briefly and then NFET2 and PFET2 are allowed to conduct reverse biasing the tool when the tool limit in signals is received.

22. An apparatus according to claim 9 wherein NFET1 is pulsed by the PWM when the soft start signals is received by the microprocessor.

23. An apparatus according to claim 1 wherein the microprocessor is programmed to provide a specific voltage.

24. An apparatus according to claim 1 wherein the tool includes a means to run the tool at a run, jog, reverse and break settings.

25. An apparatus according to claim 1 wherein the microprocessor is configured to read the run and clutch signals and includes means to report the signals to an external device.

26. A method for controlling a power supply delivering power to a DC powered tool comprising the steps of:
    providing a DC power driver tool;
    providing a DC power supply;
    connecting an interface between the power supply and the tool wherein the interface includes PFET1, PFET2, NFET1, and NFET2;
    configuring the interface to read signals from the tool;
    controlling the power supplied by the power supply to run, brake, reverse or jog the tool;
    connecting a microprocessor to the interface; and
    programming the microprocessor to provide a specific signals in response to the signals from the tool read by the interface.

27. A method according to claim 26 including the step of programming the microprocessor, when the tool is at rest, to allow PFET1 to conduct by grounding its gate an placing all remaining FETs in their non-conducting states.

28. A method according to claim 27 including the step of PFET1 providing a voltage to the tool so that signals from the tool can be read by the microprocessor.

29. A method according to claim 26 including the step of programming the microprocessor to control the gate voltages of PFET1 and NFET1.

30. A method according to claim 29 including the step of PFET1 and NFET1 providing power to the tool allowing the tool to run in a forward or clockwise manner.

31. A method according to claim 30 including the step of programming the microprocessor to ground the gate of NFET1, stopping the current flow through the tool and allowing the tool to coast to a stop.

32. An apparatus for controlling a power supply delivering power to a DC powered tool comprising:
    a DC power driver tool;
    a DC power supply;
    an interface connected between the power supply and the tool wherein the interface is configured to read signals from the tool and control the power supplied by the power supply to run, brake, reverse or jog the tool; and,
    a microprocessor connected to the interface programmed to provide a specific power in response to the signal from the tool read by the interface;
    wherein the microprocessor is configured to read the run and clutch signals and includes means to report the signals to an external device,
    wherein the external device includes a means for storing a present run time and a maximum run time, is configured to read the run and clutch signals from the microprocessor, and is configured to determine if a fastening process is good or bad based on the duration of the run signal and the existence of a clutch signal.

33. An apparatus for controlling a power supply delivering power to a DC powered tool comprising:
- a DC power driver tool;
- a DC power supply;
- an interface connected between the power supply and the tool wherein the interface is configured to read signals from the tool and control the power supplied by the power supply to run, brake, reverse or jog the tool; and,
- a microprocessor connected to the interface programmed to provide a specific power in response to the signal from the tool read by the interface,
- wherein the microprocessor is configured to read the run and clutch signals and includes means to report the signals to an external device; and
- wherein the microprocessor is configured to measure the current flowing through the tool by measuring the voltage drop across a high side current sense resistor and is configured to report the current to the external device.

34. An apparatus for controlling a power supply delivering power to a DC powered tool comprising:
- a DC power driver tool;
- a DC power supply;
- an interface connected between the power supply and the tool wherein the interface is configured to read signals from the tool and control the power supplied by the power supply to run, brake, reverse or jog the tool; and,
- a microprocessor connected to the interface programmed to provide a specific power in response to the signal from the tool read by the interface;
- wherein the microprocessor is configured to read the run and clutch signals and includes means to report the signals to an external device; and
- wherein the external device is configured to use the current signal to determine that the tool is running by comparing the current signal to a programmable threshold signal.

* * * * *

UNITED STATES PATENT AND TRADEMARK OFFICE
CERTIFICATE OF CORRECTION

| | | |
|---|---|---|
| PATENT NO. | : 7,174,973 B1 | Page 1 of 1 |
| APPLICATION NO. | : 10/876125 | |
| DATED | : February 13, 2007 | |
| INVENTOR(S) | : Richard G. Lysaght | |

It is certified that error appears in the above-identified patent and that said Letters Patent is hereby corrected as shown below:

In column 5, line 28, please delete the words "according to claim 1".

Signed and Sealed this

Tenth Day of April, 2007

JON W. DUDAS
*Director of the United States Patent and Trademark Office*